United States Patent [19]
Komoto et al.

[11] Patent Number: 5,642,114
[45] Date of Patent: Jun. 24, 1997

[54] VARIABLE LENGTH CODE DECODER USING A CONTENT ADDRESSABLE MEMORY WITH MATCH INHIBITING GATE

[75] Inventors: Eiji Komoto; Takao Nakamura, both of Tokyo, Japan

[73] Assignee: Oki Electric Industry Co., Ltd., Tokyo, Japan

[21] Appl. No.: 351,253

[22] PCT Filed: Apr. 19, 1994

[86] PCT No.: PCT/JP94/00646

§ 371 Date: Jan. 24, 1995

§ 102(e) Date: Jan. 24, 1995

[87] PCT Pub. No.: WO94/24672

PCT Pub. Date: Oct. 27, 1994

[30] Foreign Application Priority Data

Apr. 19, 1993 [JP] Japan .................................. 5-091619
Apr. 19, 1993 [JP] Japan .................................. 5-091620

[51] Int. Cl.⁶ .................................................. H03M 7/40
[52] U.S. Cl. .................................. 341/67; 341/65; 365/49
[58] Field of Search ............................ 341/65, 67; 365/49

[56] References Cited

U.S. PATENT DOCUMENTS

| | | | |
|---|---|---|---|
| 4,670,858 | 6/1987 | Almy | 365/49 |
| 5,173,695 | 12/1992 | Sun et al. | 341/67 |
| 5,245,338 | 9/1993 | Sun | 341/67 |
| 5,475,389 | 12/1995 | Song et al. | 341/67 |

FOREIGN PATENT DOCUMENTS

| | | |
|---|---|---|
| 2-45277 | 10/1990 | Japan . |
| 3-12896A | 1/1991 | Japan . |
| 4-258025A | 9/1992 | Japan . |
| 5-63586A | 3/1993 | Japan . |
| 5-95292A | 4/1993 | Japan . |

OTHER PUBLICATIONS

Daniel A. Luthi et al., "A Video-Rate JPEG Chip Set", *IEEE 1992 Custom Integrated Circuits Conference*, pp. 26.2.1–26.2.4.

*Primary Examiner*—Howard L. Williams
*Attorney, Agent, or Firm*—Spencer & Frank

[57] ABSTRACT

The present invention relates to a variable-length code decoding circuit for decoding an input variable-length code string and a variable-length code decoding system using the same. A typical variable-length code decoding circuit of the present invention includes a CAM cell 10 for storing a variable-length code bit and a RAM cell 20 which is paired with the CAM cell 10 for storing a mask bit so as to perform a masking operation. The variable-length code decoding circuit further includes an NMOS transistor 30 which is coupled between the CAM cell 10 and a match line ML for selectively disconnecting the CAM cell 10 from the match line ML in response to an output of the RAM cell 20. The CAM cell 10 collates a bit of the input variables-length code string with the stored code bit. When the input bit matches the stored code bit, the CAM cell 10 outputs an H level matching to the match line ML and otherwise it outputs an L level unmatching to the match line ML. If the CAM cell 10 does not relate to the collating operation that is, if it does not matter whether there is a match, the RAM cell 20 corresponding to the CAM cell 10 outputs an L level signal to turn off the NMOS transistor 30. When the NMOS 30 is turned off, the output of the CAM cell 10 is not transmitted to the match line ML.

17 Claims, 6 Drawing Sheets

VARIABLE LENGTH CODE DECODER USING A CONTENT ADDRESSABLE MEMORY WITH MATCH INHIBITING GATE

BACKGROUND OF THE INVENTION

The present invention relates to a variable-length code decoding circuit for decoding a compressed image, etc. and to a system for decoding variable-length code using the same.

There is the following literature disclosing a technique for decoding a variable-length code.

Literature: IEEE 1992 Custom Integrated Circuits Conference, "A Video-Rate, JPEG Chip Set" p. 26. 2. 1–26. 2. 4., authored by Daniel A. Luthi, Po Tong, and Peter A. Ruetz.

This literature discloses a technique using a variable-length code as a means for compressing image data or for restoring and decoding the compressed image data.

A variable-length code means a code which is allocated in response to the frequency of occurrence of parameters after the image data has been subjected to an arithmetic operation such as a Discrete Cosine Transform (hereinafter referred to as DCT) operation and a quantization operation. That is, a short code is allocated to a parameter which frequently occurs while occurs a long code is allocated to a parameter which less frequently. By varying the length of the code as mentioned above, the total length for a sequence number of codes can be reduced as a whole, thereby realizing an improvement in the compression rate of the image data.

Since the image display rate on of a TV set or a monitor must be kept at a given value when restoring a dynamic image, the variable length code as set forth above is always required to be restored at a constant rate. It is preferable in practice to decode one variable-length code in one clock cycle. Since image data is required to be processed at high speed in recent years, an improvement in the decoding speed of the variable-length code is important as one means for realizing a high processing speed of the image data.

It is an object of the invention to provide a variable-length code decoding circuit for realizing high operation speed.

It is another object of the invention to provide a variable-length code decoding system for realizing a high operation speed.

SUMMARY OF THE INVENTION

To achieve the above objects, the present invention comprises a data line to which a first data is applied, a storage circuit coupled to the data line for storing a second data wherein the storage circuit collates the first data with the second data and outputting a collating result, a collating result output line to which the collating result is applied, a gate coupled between the storage circuit and the collating result output line for inhibiting the collating result from being output to the collating result output line in response to a control signal, and a control circuit for outputting the control signal.

To achieve the above objects, the present invention comprises a plurality of data lines to which each of a plurality of first code data in a first variable-length code data is applied, a plurality of storage circuits coupled to the plurality of the data lines for storing each of a plurality of second code data of a second variable-length code data wherein the storage circuits collates the first code data with the second code data and outputting a collating result, a collating result output line to which the collating result is applied, a plurality of gates each coupled between the plurality of storage circuits and the collating result output line for inhibiting the collating result from being output to the collating result output line in response to a control signal, and a plurality of control circuits for outputting the control signal.

Further, to achieve the above objects, the present invention comprises a plurality of data lines to which each of a plurality of first code data of a first variable-length code data is applied, a plurality of first storage circuits each coupled to the plurality of the data lines for storing each of a plurality of second code data of a second variable-length code data wherein the plurality of first storage circuits collate the first code data with the second code data and outputting a first collating result, a first collating result output line to which the first collating result is applied, a plurality of first gates each coupled between the plurality of first storage circuits and the first collating result output line for inhibiting the first collating result from being output to the first collating result output line in response to a first control signal, a plurality of first control circuits for outputting the first control signal, a plurality of second storage circuits each coupled to the plurality of the data lines for storing each of a plurality of third code data of a third variable-length code data wherein the plurality of second storage circuits collate the first code data with the third code data and outputting a second collating result, a second collating result output line to which the second collating result is applied, a plurality of second gates each coupled between the plurality of second storage circuits and the second collating result output line for inhibiting the second collating result from being output to the second collating result output line in response to a second control signal, and a plurality of second control circuits for outputting the second control signal.

Still further, to achieve the above objects, the present invention comprises an input node to which a variable-length code string having a plurality of variable-length codes is applied, a variable-length code decoding circuit for detecting one of the variable-length codes of the variable-length code string and outputting a first data representing a code length of the detected variable-length code, a first latch circuit for latching a second data representing positions of the variable-length codes of the variable-length code string which is applied to the input node in response to a clock signal and outputting the latched second data, a regulating circuit coupled to the input node for shifting positions of the variable-length codes of the variable-length code string which is applied to the input node so that the variable-length code to be decoded by the variable-length code decoding circuit becomes a leading code of the variable-length code string in response to the first and second data, and outputting the shifted variable-length code, and a second latch circuit for latching an output of the regulating circuit in response to the clock signal and outputting the latched output to the variable-length code decoding circuit.

DESCRIPTION OF THE PREFERRED EMBODIMENTS

Figure 6A:
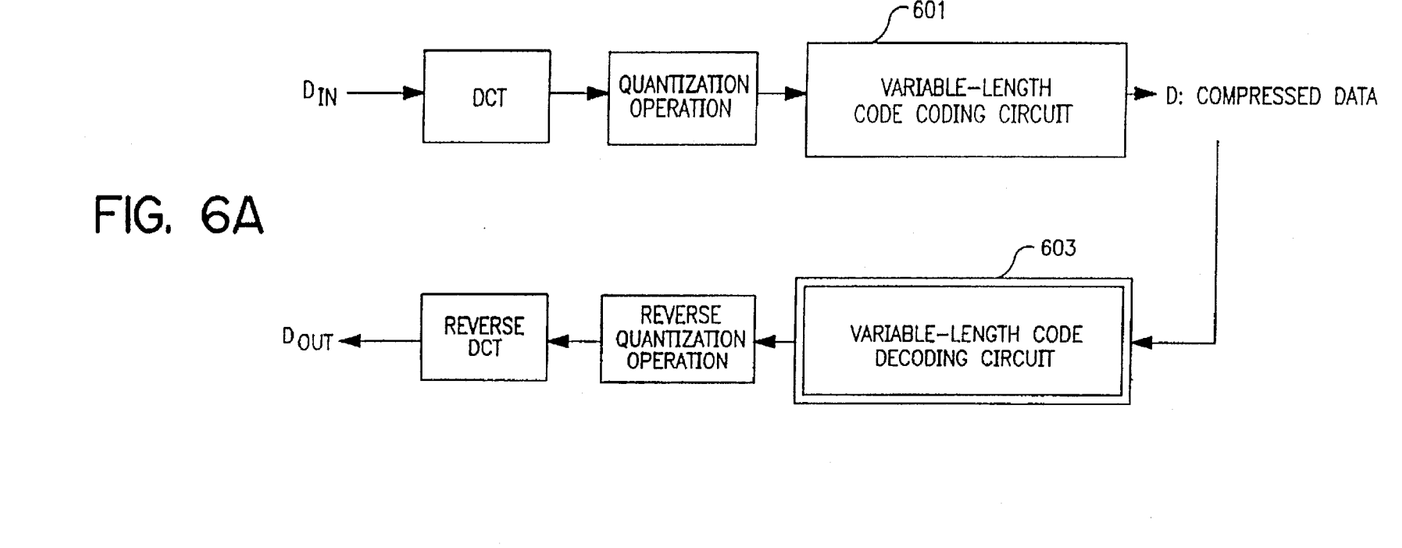
FIGS. 6A and 6B are schematic views showing the variable-length code decoding circuit and the variable-length code decoding system according to the present invention.

In general, image data is processed in accordance with a flow chart, for example, as shown in FIG. 6A.

Figure 6B:
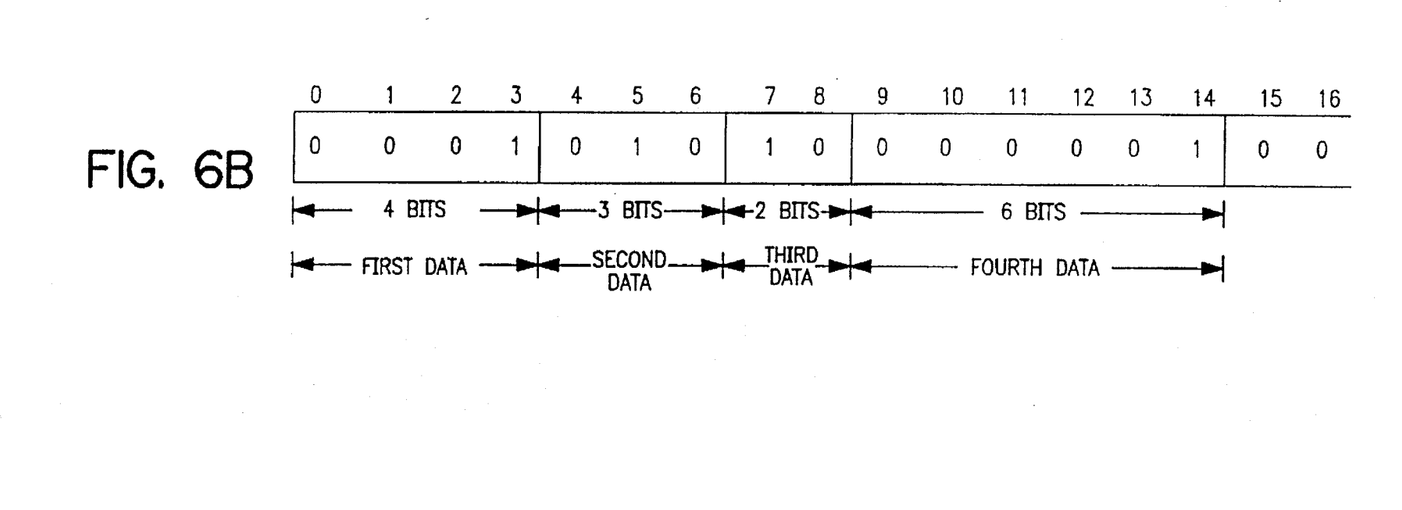

That is, an input image data Din is subjected to a DCT operation and thereafter it is subjected to a quantization operation. The resultant quantizized image data is supplied to a variable-length code coding circuit 601. The variable-length code coding circuit 601 subjects the quantizized image data to a coding operation and outputs a compressed data D, the details of which are shown in FIG. 6B. The compressed data D is subjected to a reverse quantization operation after it was decoded by a variable-length code decoding circuit 603 and it is subjected to a reverse DCT operation, and thereafter it is output as an output image data Dout.

The present invention, which will be described hereinafter in detail, relates to an arrangement corresponding to the variable-length code decoding circuit 603 as shown in FIG. 6(A).

The present invention will be described hereinafter in detail.

Figure 1:
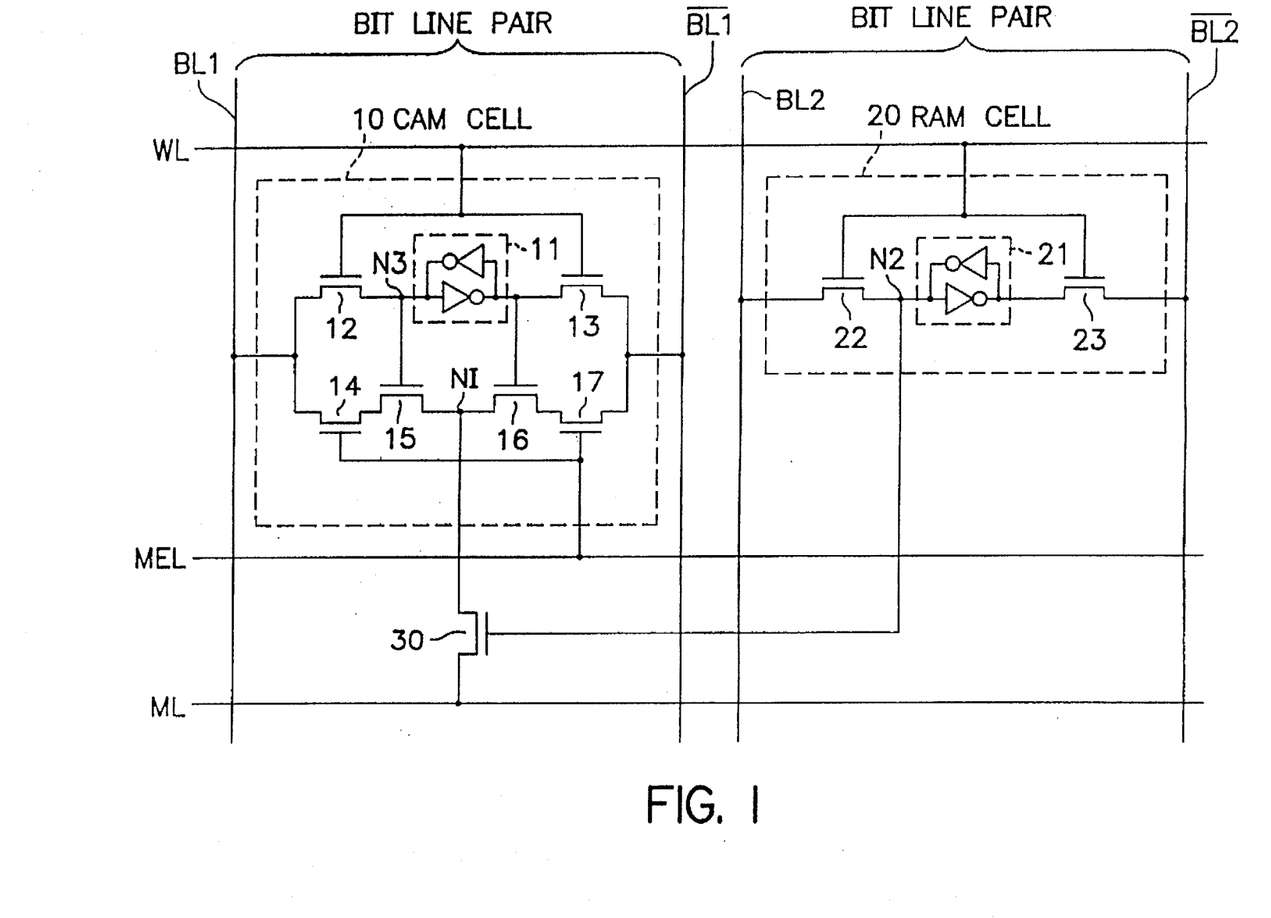
FIG. 1 is a circuit diagram showing a main part of a variable-length code decoding circuit according to a preferred embodiment of the invention.

FIG. 1 is a circuit diagram showing a main part of a variable-length code decoding circuit according to a preferred embodiment of the invention. The variable-length code decoding circuit comprises Content Addressable Memory (hereinafter referred to as a CAM) cell 10 provided at an intersection between a bit line pair (BL1 and an inverse BL1 (hereinafter referred to as ($\overline{BL1}$)) and a word line WL and a Random Access Memory (RAM) cell 20 provided at an intersection between a bit line pair (BL2 and an inverse BL2 (hereinafter referred to as ($\overline{BL2}$)) and the word line WL, and a switch (MOS transistor) 30 which permits the CAM cell 10 and a match line ML to be connected in response to an output of the RAM cell 20.

The CAM cell 10 comprises a data memory part for storing a code bit of a variable-length code and a data collating part for outputting a result of collation between a code bit applied from the bit line pair and the code bit as stored in the data memory part.

The data memory part comprises a flip-flop 11 (latch circuit) for storing the code bit of the variable-length code, an NMOS transistor 12 having a gate which is controlled by the potential of the word line WL for electrically coupling one node of the flip-flop 11 and the bit line BL1 to each other and an NMOS transistor 13 having a gate which is controlled by the potential of the word line WL for electrically coupling the other node of the flip-flop 11 and the inverse bit line $\overline{BL1}$ to each other.

The data collating part comprises an NMOS transistor 14, an NMOS transistor 15, an NMOS transistor 16 and an NMOS transistor 17 which are coupled in series between the bit line BL1 and the inverse bit line $\overline{BL1}$. The gates of the NMOSs 14 and 17 are commonly coupled to the match enable line MEL while the gate of the NMOS 15 is coupled to one node of the flip-flop 11 and a gate of the NMOS 16 is coupled to the other node of the flip-flop 11. The NMOS 15 and the NMOS 16 are commonly coupled to a collating result output node N1.

The RAM cell 20 comprises a flip-flop 21 (latch circuit) serving as a data memory means for storing mask data, an NMOS transistor 22 having a gate which is controlled by the potential of the word line WL for coupling one node of the flip-flop 21 and the bit line BL2 to each other, and an NMOS transistor 23 having a gate which is controlled by the potential of the word line WL for coupling the other node of the flip-flop 21 and the inverse bit line $\overline{BL2}$ to each other.

There is provided an NMOS transistor 30 between the collating result output node N1 of the CAM cell 10 and the match line ML wherein the NMOS 30 has a gate which is controlled by the potential appearing on one node of the flip-flop 21 for electrically coupling the collating result output node N1 and the match line ML to each other.

The operation of the main part of the variable-length code decoding circuit having the arrangement as set forth above will be described hereinafter.

(The operation of the RAM cell 20)

When the word line WL is changed to the H level (e.g., VCC level), the NMOSs 22 and 23 are ON. At this time, suppose that the H level is applied to the bit line BL2 and the L level is applied to the inverse bit line $\overline{BL2}$, (that is suppose data "1" is applied to the bit line pair coupled to the RAM cell). Then the H level potential of the bit line BL2 is applied to one node of the flip-flop 21 by way of the NMOS 22 while the L. level potential of the inverse bit line $\overline{BL2}$ is applied to the other node of the flip-flop 21 by way of the NMOS 23. That is, it means that the flip-flop 21 stores the data "1".

Now, suppose that the L level is applied to the bit line BL2 and the H level is applied to the inverse bit line $\overline{BL2}$, (that is a suppose data "0" is applied to the bit line pair coupled to the RAM cell). The potential of L level potential of the bit line BL2 is applied to one node of the flip-flop 21 by way of the NMOS 22 while the H level potential of the inverse bit line $\overline{BL2}$ is applied to the other node of the flip-flop 21 by way of the NMOS 23. That is, it means that the flip-flop 21 stores the data "0", contrary to the previous case.

(The operation of CAM cell 10)

The data storage part of the CAM cell 10 (the flip-flop 11, the NMOS transistor 12 and the NMOS transistor 13) operates in the same manner as the RAM cell 20. The CAM cell 10 is different from the RAM cell 20 in that the former includes a data collating part.

Suppose that the data storage part stores the data "1". Suppose that when the potential of the word line WL is changed to the H level, a code data "1" constituting one bit of a variable-length code is applied to the bit line pair coupled to the CAM cell 10, and at the same time the potential of the match enable line MEL is at H level. Since the node N3, which is an output node of the data storage part, is H level, the NMOS 15 is at the ON. Since the potential of the match enable line MEL is at the H level, the NMOS 14 is also ON. Accordingly, the H level potential of the bit line BL1 is applied to the collating result output node N1 by way of the NMOS 14 and the NMOS 15. On the other hand, since the other potential of the flip-flop 11 is at the L level, the NMOS 16 is OFF. Accordingly, the L level potential of the inverse bit line $\overline{BL1}$ is not applied to the collating result output node N1.

Suppose that a code data "0" constituting one bit of the variable-length code is applied to the bit line pair coupled to the CAM cell 10. Since the node N3 serving as the output node of the data storage part is at the H level, the NMOS 15 is ON. Further, since the potential of the match enable line at the MEL is H level, the NMOS 14 is also ON. Accordingly, the L level potential of the bit line BL1 is applied to the collating result output node N1 by way of the NMOS 14 and the NMOS 15. Whereupon, since the other potential of the flip-flop 11 is at the L level, the NMOS 16 is OFF. Accordingly, the H level potential of the inverse bit line $\overline{BL1}$ is not applied to the collating result output node N1.

Supposing that the potential the polential at the output node N2 of the flip-flop 21 of the RAM cell 20 is at the H level (i.e., the data stored in the RAM cell 20 is "1"), the NMOS 30 is ON so that the potential applied to the collating result output node N1 is applied to the match line ML. If the code data "1" is applied to the bit line pair coupled to the CAM cell 10, the potential of the match line ML is changed to the H level by the H level potential of the collating result output node N1. If the code data "0" is applied to the bit line pair coupled to the CAM cell 10, the potential of the match line ML is changed to the L level by the L level potential of the collating result output node N1. That is, the CAM cell 10 outputs the H level from the collating result output node N1 when the data applied to the bit line pair coupled to the CAM cell 10 matches the data stored in the CAM cell 10 while it outputs the L level when the data applied to the bit line pair coupled to the CAM cell 10 does not match the data stored in the CAM cell 10.

The RAM cell 20 stores the data "1" beforehand if it is necessity to transmit the result of the operation of the CAM cell 10 to the match line ML, while it stores the data "0" if it is not necessary to transmit such result. The necessity or non-necessity of transmission of the result of operation of the CAM cell 10 is decided when the code data is stored in the CAM cell 10. This will described later in more detail.

An embodiment of the variable-length code decoding circuit will be described hereinafter with reference to FIG. 2.

Figure 2:
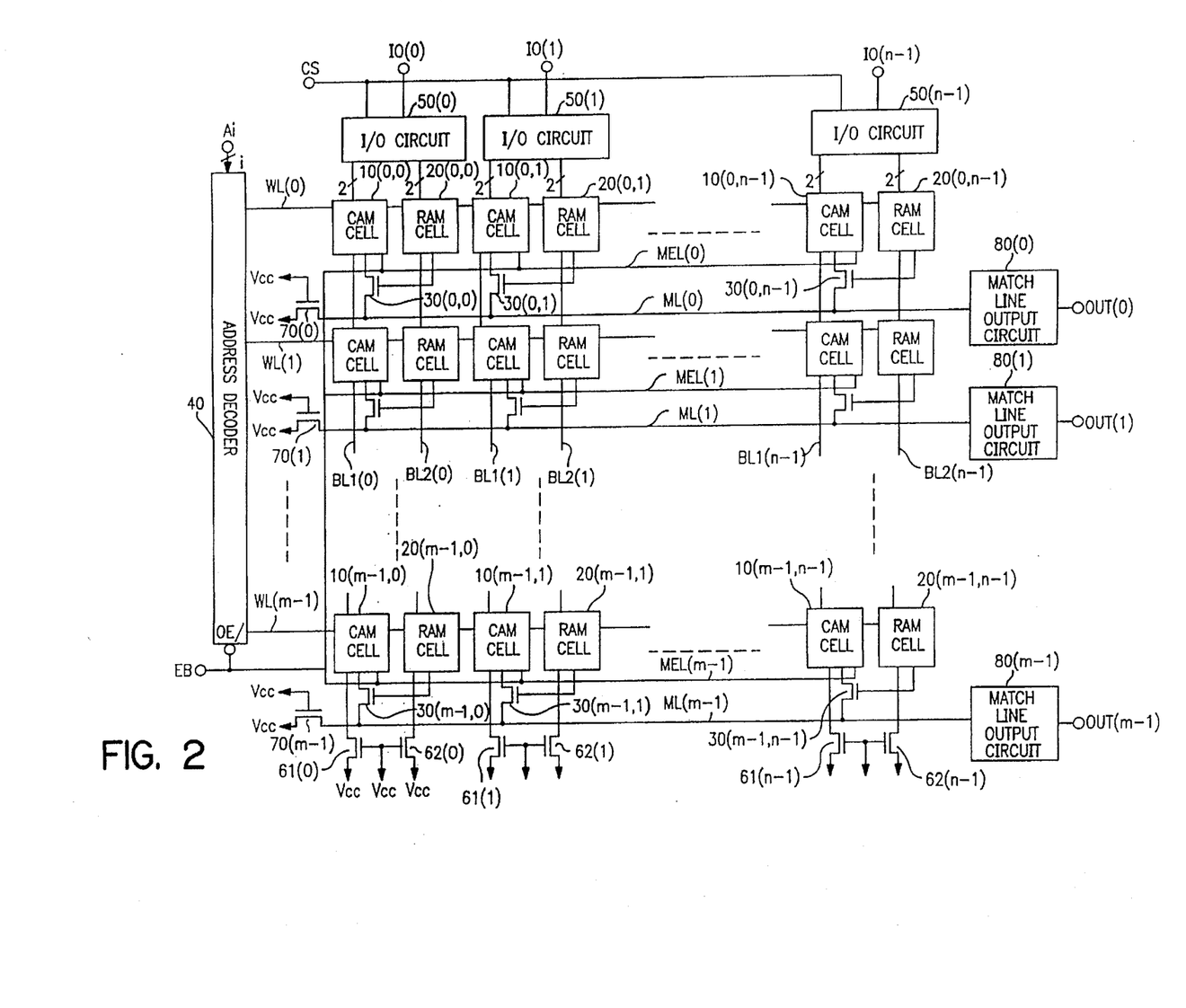
FIG. 2 is a circuit diagram of a variable-length code decoding circuit according to the preferred embodiment of the invention.

FIG. 2 is a view showing the variable-length code decoding circuit according to the embodiment of the present invention. The variable-length code decoding circuit comprises a plurality of memory cell selecting word lines WL (0) to WL (m−1), a plurality of match lines ML (0) to ML (m−1), a plurality of match enable lines MEL (0) to MEL (m−1) and bit line pairs BL1 (0) to BL1 (n−1) and BL2 (0) to BL2 (n−1) which are arranged at intersections between these word lines, match lines and match enable lines. (In FIG. 2, although each of the bit line pairs is illustrated by only one line for facilitating the explanation, in practice the bit line is paired as shown in FIG. 1.) A plurality of groups of CAM cells 10 (0, 0) to 10 (m−1, n−1) and a plurality of groups of RAM cells 20 (0,0) to 20 (n−1, n−1) are paired and arranged at intersections between these lines. MOS transistors 30 (0,0) to 30 (m−1, n−1) serving as switches which are controlled by outputs of the RAM cells are coupled between each of the CAM cells and the match lines. The arrangement of the CAM cells and the RAM cells in FIG. 2 is an array based on the arrangement of the CAM cell and the RAM cell in FIG. 1, arranged in plural.

Code data of a variable-length code is stored in each CAM cell. One variable-length code comprises a plurality of code data bits which are stored in a plurality of CAM cells corresponding to the same word lines. The data as stored in each RAM cell depends on whether the corresponding CAM cell needs or does not need the collating operation.

Figure 3:
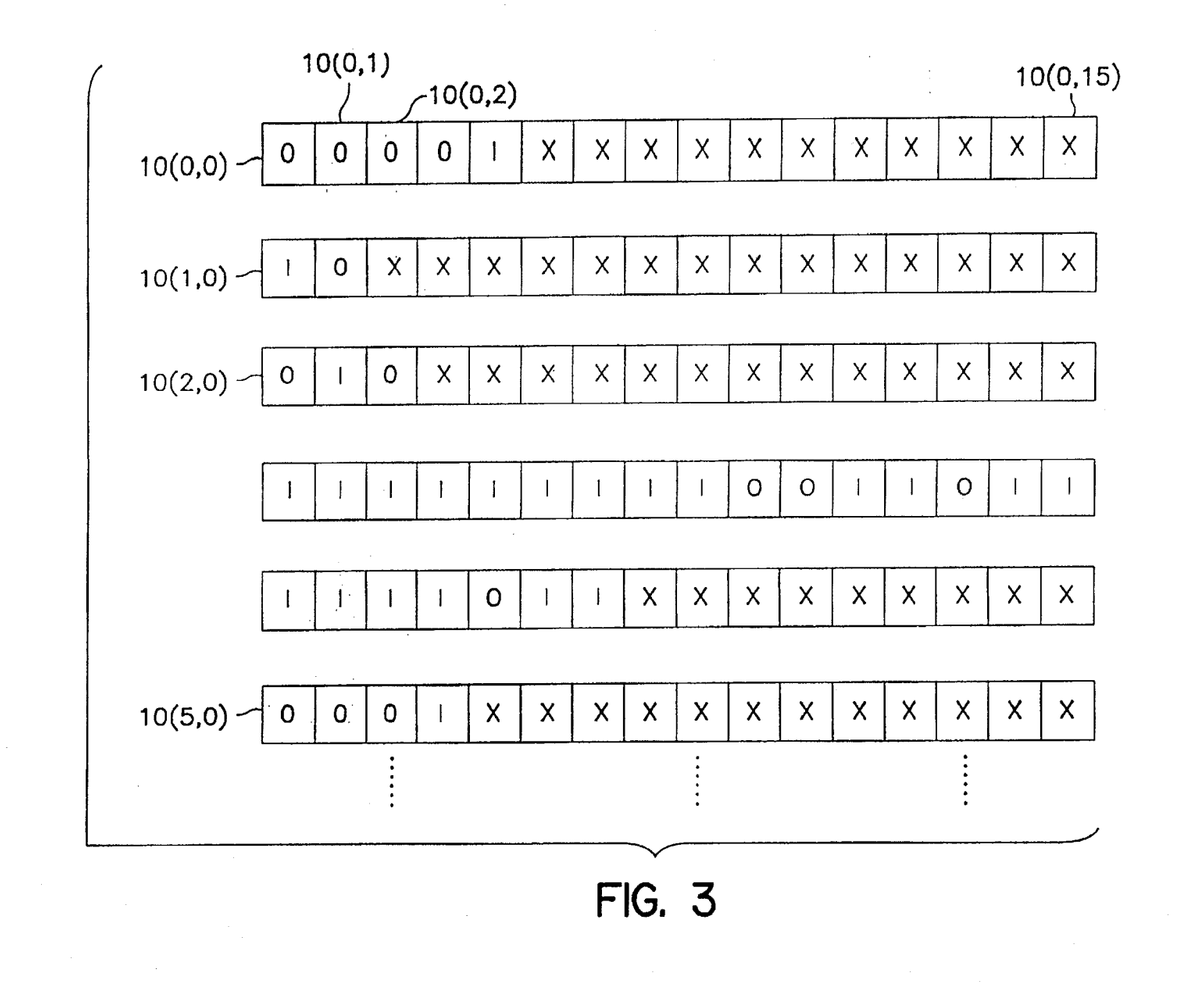
FIG. 3 shows a variable-length code table of the variable-length code decoding circuit in FIG. 2.

FIG. 3 shows a table of the variable-length code which can be used in the decoding circuit in FIG. 2. In FIG. 3, each bit position corresponds to a location where a cell pair CAM cell and RAM cell as shown in FIG. 2 is positioned. A bit position where "0" is shown indicates that the code data "0" is stored in the CAM cell, while a bit position where "1" is shown indicates that the code data "1" is stored in the CAM cell. A bit position where "X" is shown indicates that the data "0" is stored in the RAM cell. That is, it means that a collating result output of the corresponding CAM cell is not applied to the match line ML regardless of the code data in the corresponding CAM cell.

For example, since a variable-length code "00001" as stored in a first word comprises five bits, it is not necessary to perform a collating operation for the sixth bit or succeeding bits. That is, the first word is a word where the variable-length code "00001" is subjected to the collating operation. Accordingly, it is does not matter if the sixth bit or succeeding bits are subjected to the collating operation. As a result, the RAM cell for the sixth bit invalidates the output of the corresponding CAM cell, as do the RAM cells for the following bits. (It means that the collating operation per se may be performed but the collating result must not be output to the match line ML.) A variable-length code "10" as stored in a second word comprises two bits, so that it is necessary to subject the third bit and succeeding bits to a collating operation. That is, since the second word is a word where the variable-length code "10" is subjected to the collating operation, it does not matter if the third bit and succeeding bits are subjected to the collating operation. Accordingly, the RAM cell which is positioned at the third bit invalidates the output of the corresponding CAM cell, and the same for the following bits. (It means that the collating operation may be performed but the collating result must not be output to the match line ML.) Since the variable-length code "1111111110011011" as stored in the fourth word comprises 16 bits, the data "1" is stored in all the corresponding RAM cells so as to validate the outputs of the CAM cells to the match lines.

The collating result output node N1 of each CAM cell is coupled to the match lines ML (0) to ML (m−1) by way of the NMOSs 30 (0, 0) to 30 (m−1, n−1). The NMOSs 30 (0, 0) to 30 (m−1, n1) are subjected to ON-OFF control in response to the corresponding outputs of the RAM cells. A plurality of NMOSs 30 (0, 0) to 30 (O−1, n−1) corresponding to the same word line WL (0) are subjected to a wired OR to a single match line ML (0) corresponding to the same word line WL (0) and are coupled to a match line output circuit 80 (0). The same applies to the couplings between the match lines ML and the match line output circuits of the other NMOSs.

A plurality of word lines WL (0) to WL (m−1) are selected by an address decoder 40 which decodes an address signal Ai. The address decoder 40 has an inverse output enable terminal OE/for receiving a match enable signal EB. Each of the bit line pairs BL1 (0) to BL1 (n−1), BL2 (0) to BL2 (n−1) is coupled to input/output circuits (hereinafter referred to as I/O circuits) 50 (0) to 50 (n−1) each having a selection circuit for selecting one of the bit line pairs coupled to a write circuit, a read circuit and the CAM cell or the bit line pairs coupled to the RAM cell. Further, a power supply potential VCC is applied to these bit line pairs by way of loading NMOSs 61 (0) to 61 (n−1) and NMOSs 62 (0) to 62 (n−1). The loading NMOSs are set to be small in their driving capacity. Accordingly, the potential of the bit line pair is not varied by the loading NMOSs in case of writing data in the write circuit or reading data from the read circuit.

Each of the I/O circuits 50 (0) to 50 (n−1) is coupled to input/output terminals (hereinafter referred to as I/O terminals) IO (0) to IO (n−1) for performing a data input/output operation and to a control terminal CS to which a control signal CS for controlling the data input/output operation is applied.

The match enable lines MEL (0) to MEL (m−1) are commonly coupled to a match enable terminal EB to which a match enable signal EB is applied. The match lines ML (0) to ML (m−1) receive the power supply potential VCC at one end thereof by way of NMOSs 70 (0, 0) to 70 (m−1, n−1) and are coupled to match output terminals OUT (0) to OUT (m−1) at the other end thereof by way of match line output circuits 80 (0) to 80 (m−1).

The operation of the variable-length code decoding circuit as set forth above will be described hereinafter in detail with reference to FIGS. 2 and 3.

The operation of the variable-length code decoding circuit comprises (1) a variable-length code writing operation for writing variable-length codes as shown in FIG. 3 in each of the CAM cells and RAM cells and at the same time invalidating the outputs of the CAM cells positioned in the remaining bit positions where the variable-length codes are not written (what is called a mask processing) and (2) a matching or collating operation for collating variable-length codes with variable-length codes as stored in the CAM cells.

1. Variable-Length Code Writing Operation

The match enable signal EB is first changed to the "L" level. The match enable lines MEL (0) to MEL (m−1) are changed to the "L" level so that the NMOSs 14 and 17 are OFF. When each of the NMOSs 14 and 17 are OFF, the operation of the data collating part in each CAM cell is inhibited. Accordingly, each CAM cell operates as a normal RAM which does not perform a data collating operation.

When the match enable signal EB is changed to "L" level, the address decoder 40 is enabled. The enabled address decoder 40 permits the potential of a single word line WL alone to be at the "H" level in response to the address signal Ai. (The single word line WL alone is selected.)

Next, when the control signal CS is changed to the "L" level, a write circuit, not shown, in the I/O circuits 50 (0) to 50 (n−1) is enabled. When a selector circuit, not shown, in the I/O circuits 50 (0) to 50 (n−1) is operated so as to select bit line pairs BL1 (0) to BL1 (n−1) which are coupled to the CAM cells, the CAM cells are ready for receiving the variable-length code. For example, suppose that the address decoder 40 sets the address signal Ai so as to select the word line WL (1) and that the data "1" is applied to the I/O terminal IO (0) and the data "0" is applied to the I/O terminal IO (1). As a result, the code data "1" is written in the CAM cell 10 (1, 0) and the code data "0" is written in the CAM cell 10 (1, 1).

Next, when the selector circuit, not shown, in the I/O circuits 50 (0) to 50 (n−1) is operated so as to select bit line pairs BL2 (0) to BL2 (n−1) which are coupled to the RAM cells, the RAM cells are ready for receiving the mask data. For example, suppose that the address decoder 40 sets the address signal Ai so as to select the word line WL (1) and that a mask data "1" is applied to each of the I/O terminals IO (0) to IO (1) and the mask data "0" is applied to each of the I/O terminals IO (2) to IO (15). As a result, the mask data "0" is written in the RAM cell 10 (1, 0) to the RAM cell 10 (1, 1) and the mask data "1" is written in the RAM cell 10 (0, 2) to the RAM cell 10 (1, 5).

The aforementioned operations mean that the variable-length code which is stored in the second word is "10" and its code length is "2 bits"(16 bits—a bit where the mask data "1" is stored). A memory such as a RAM is coupled to the match output terminal OUT (1) wherein the variable-length code "10" having the code length of "2 bits" is stored in this memory at a position of the word corresponding to the match output terminal OUT (1). The aforementioned operations correspond to the second word in FIG. 3.

Likewise, a variable-length code and the mask data are written in each row or word.

2. Matching Operation

The match enable signal EB is first changed to the "H" level. Then, the address decoder 40 is changed to an operation inhibiting state so that all the word lines WL (0) to WL (m−1) coupled to the address decoder 40 are changed to the "L" level. At the same time, the bit line pairs BL1 (0) to BL1 (n−1), BL2 (0) to BL2 (n−1) are changed to the "H" level.

When the control signal CS is changed to the "L" level, the write circuits, not shown, in the I/O circuits 50 (0) to 50 (n−1) are enabled. When the selector circuits, not shown, in the I/O circuits 50 (0) to 50 (n−1) are operated so as to select the bit line pairs BL1 (0) to BL1 (n−1) coupled to the CAM cells, the CAM cells are ready for receiving the variable-length code to be decoded.

For example, suppose that a variable-length code data Di of an infinite array which is to be decoded and shown in FIG. 6(B) is applied to the I/O terminals IO (0) to IO (15). The variable-length code decoding circuit according to the present embodiment can decode the variable-length code having a code length of 16 bits at maximum. Accordingly, the variable-length code data Di extending from the leading bit to the sixteenth bit is once input to the I/O terminals IO (0) to IO (15). When the data Di having a 16 bit length is applied to the I/O terminals IO (0) to IO (15), the data Di is applied to the bit line pairs BL1 (0) to BL1 (n−1). Since all the CAM cells are coupled to the bit line pairs BL1 (0) to BL1 (n−1), all the CAM cells start the collating operation with the data Di having a 16 bit length at the same time. When the code data stored in a CAM cell matches the data input thereto the, "H" level is output to a corresponding match line and when the former does not match the latter, the "L" level is output to the corresponding match line. In the same row or word, when it is detected that even one code data stored in a CAM cell does not match the data input thereto, the match line ML is changed to the "L" level. Since a CAM cell corresponding to a RAM cell which stores the mask data "0" is electrically disconnected from the match line ML, the only CAM cells which outputs collating outputs is the CAM cells corresponding to the RAM cells which store the mask data "1".

Referring to the variable-length code table in FIG. 3, it is evident that a first data "0001" of the data Di having a 16 bit length matches the data of the sixth word of the same table. Since the CAM cells 10 (5, 0) to 10 (5, 3) corresponding to the sixth word of the variable-length code decoding circuit output the "H" level to each collating result output node, the match line ML (5) is changed to the "H" level. As to other rows or words, since at least one of the CAM cells which are positioned at the same row or word outputs the "L" level, all the match lines ML for these rows are changed to the "L" level.

The match line output circuit 80 (5) outputs a detection signal which informs the output terminal OUT (5) that the match line ML (5) has changed to the "H" level. The RAM, not shown, coupled to the output terminal OUT (5) informs an external circuit, described later, that the variable-length code "0001" having the code length of 4 bits has been detected.

To decode the variable-length code which follows the variable-length code "0001", the external circuit discards the first data which has been already decoded. As a means for rounding down the first data, the external circuit shifts the data Di to the left by the code length (4 bits) of the first data and applies this shifted data again to the I/O terminals IO (0)

to IO (15) of the variable-length code decoding circuit. When this data Di is applied to the I/O terminals IO (0) to IO (15), the data Di is applied to the bit line pairs BL1 (0) to BL1 (n–1) like the previous case. Since all the CAM cells are coupled to the bit line pairs BL1 (0) to BL1 (n–1), they start the collating operation with this data Di at the same time.

Referring to the variable-length code table in FIG. 3, it is evident that a second data "010" of the data Di matches the data of the third word of the same table. Since the CAM cells 10 (2, 0) to 10 (2, 1) corresponding to the third word of the variable-length code decoding circuit output the "H" level to each collating result output node, the match line ML (2) is changed to the "H" level. As to other rows or words, since at least one of the CAM cells which are positioned at the same row or word outputs the "L" level, all the match lines ML for these rows are changed to the "L" level.

The match line output circuit 80 (2) outputs a detection signal which informs the output terminal OUT (2) that the match line ML (2) has changed to the "H" level. The RAM, not shown, coupled to the output terminal OUT (2) informs an external circuit, described later, that the variable-length code "010" having a code length of "3 bits" has been detected.

The aforementioned operations are repeated so that the variable-length code decoding circuit decodes the variable-length code of the infinite array and determines the code length thereof.

There are two points to be noted especially in the aforementioned operations. Since all the storage circuits for storing the variable-length code in the collating operation are coupled to the corresponding bit lines, the collating speed is constant regardless of the position of the row or word of the storage circuit where the variable-length code corresponding to the signal input signal is stored. That is, in the collating operation of the variable-length code in the input signal, the variable-length code decoding circuit of the present invention is quicker than a circuit wherein the collating operation is performed sequentially from the storage circuit positioned at the first word to the storage circuit positioned at the last word. Another point to be noted is that the code length can be also detected at the same time with the collating operation since the control circuit for inhibiting the output operation of the storage circuit which stores the variable-length code is provided in correspondence with each storage memory. The fact that the code length can be detected at the same time with the collating operation dispenses with the application of a length code of the input data to each of the variable-length codes. Accordingly, compression of the image data is facilitated, which results in image processing at high speed. Further, the variable-length code which has been already collated can be discarded at high speed, which results in decoding of the variable-length code at high speed.

An embodiment of the variable-length code decoding system of the present invention will be described hereinafter with reference to FIGS. 4 and 5.

Figure 4:
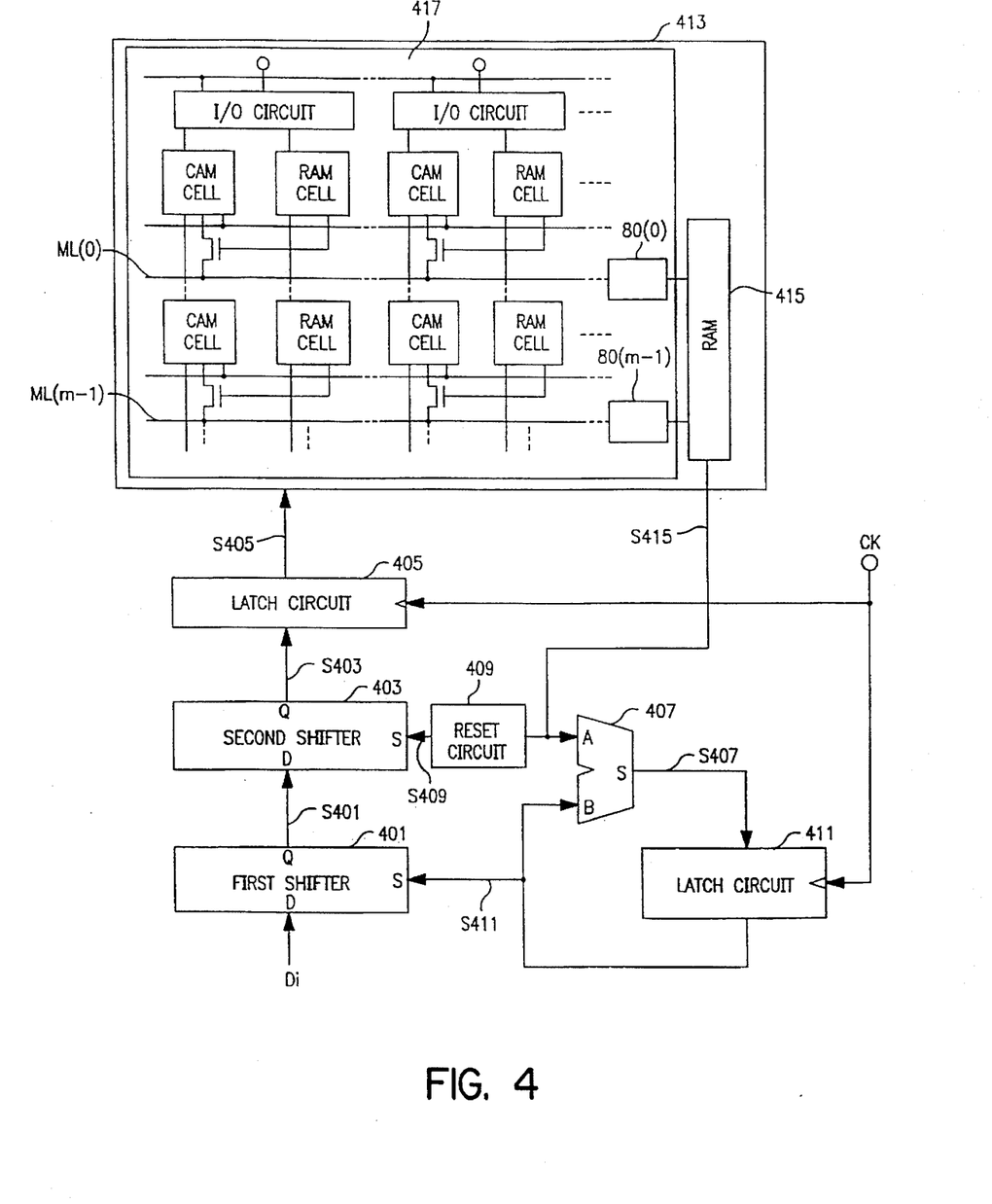
FIG. 4 is a circuit diagram of a variable-length code decoding system according to a preferred embodiment of the invention.
Figures 5A, 5B:
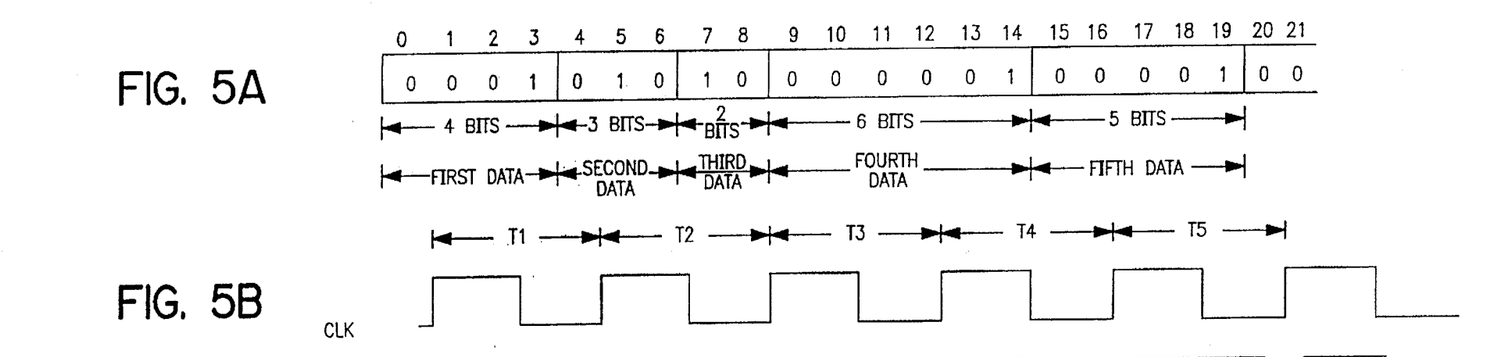
FIGS. 5A–5G are a timing chart showing the operation of the variable-length code decoding system in FIG. 4.

FIG. 4 is a circuit diagram of a variable-length code decoding system according to an embodiment of the invention. In FIG. 4, a variable-length code decoding circuit 417 is the same as the aforementioned variable-length code decoding circuit and a RAM 415 coupled to an output of the variable-length code decoding circuit 417 is the same as the aforementioned RAM. The variable-length code decoding system of the present invention comprises a variable-length code decoding part 413, first and second shifters 401 and 403 for shifting and outputting stored data in response to a shift signal (instruction) that is input to a shift terminal S, latch circuits 405 and 411 for latching the data in response to a clock signal, an adder 407 for adding a shift instruction S415 that is output from the variable-length code decoding part 413 and a shift instruction output from the latch circuit 411 and a reset circuit 409.

For example, the variable-length code data Di having a 16 bit length is applied to the first shifter 401. The first shifter 401 shifts the variable-length code data Di in response to a shift amount represented by a shift instruction S411. The first shifter 401 further outputs the shifted variable-length code data Di to the second shifter 403 as a data S401.

The data S401 which is output from the first shifter 401 is applied to the second shifter 403. The second shifter 403 shifts the data S401 in response to a shift amount (in response to an output S409 of the reset circuit 409 at the initialization) represented by the shift instruction 415. The second shifter 403 outputs the shifted data to the latch circuit 405 as data S403.

The latch circuit 405 latches the data S403 which is output from the second shifter 403 in response to the clock signal and outputs this latched data to the I/O terminals of the variable-length code decoding circuit 417 as data S405.

The RAM 415 detects the aforementioned collated variable-length code and its code length. In the variable-length code decoding system, the RAM 415 outputs the length of the collated variable-length code as the shift instruction S415.

The latch circuit 411 latches a shift instruction S407 which is output from the adder 407 in response to the clock signal and outputs this latched instruction to the first shifter 401 as the shift instruction S411.

FIG. 5A shows an example of the variable-length code input data Di. FIGS. 5B–5G illustrate a timing chart showing the operation of the variable-length code decoding system.

The operation of the variable-length code decoding system as shown in FIG. 4 will be described hereinafter with reference to FIGS. 5A–5G.

In the initial state, since the latch circuit 411 is reset, the shift instruction 411 as its output is 0. (The latch circuit 411 applies an instruction to shift the data by 0 bits to the first shifter 401.)

The reset circuit 409 outputs in its initial state 0 as the shift instruction S409. Accordingly, the shift amount of the first shifter 401 and the second shifter 403 is 0. Further, since collation of the variable-length code has not yet not been performed, we will assume that the shift instruction S415 is also 0.

In the initial state as mentioned above, the variable-length code string (the first data unit of 4 bits, the second data unit of 3 bits, . . . ) as shown in FIG. 5A is applied to the first shifter 401. When the clock signal rises (See FIG. 5B), the first shifter 401 shifts the variable-length code string by the amount (0 bits) which is specified by the shift instruction S411 (See FIG. 5F). Accordingly, the first shifter 401 outputs the shift data S401 (0001010 . . . ) to the second shifter 403 (see FIG. 5G). The data S401 of the first shifter 401 does not vary unless the shift instruction S411 varies. On the other hand, the shift instruction S411 varies only when the clock signal rises. Accordingly, the output S401 does not vary during a cycle T1.

In the early stage of the cycle T1, the second shifter 403 shifts the data S401 by the amount specified by the shift instruction S415 (in the initial state since the reset signal is output from the reset circuit 409, the shift amount is 0 bits) and outputs the shifted data S403 (0001010 . . . ) to the latch circuit 405.

Figure 5C:
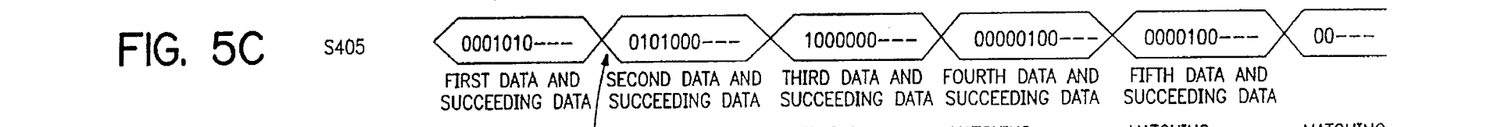
Figure 5D:
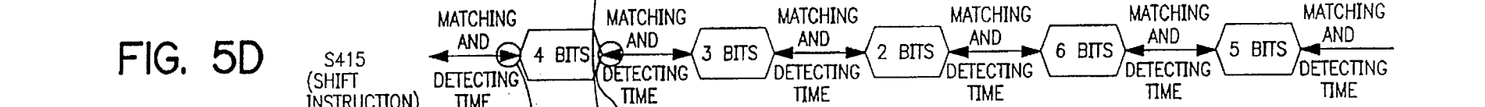
Figure 5E:
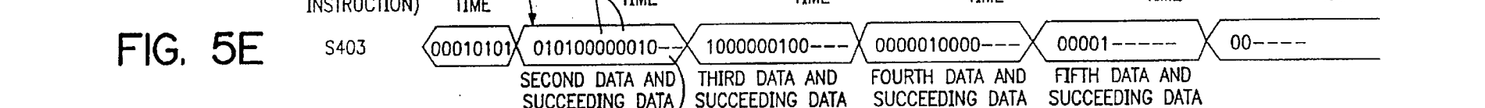
Figures 5F, 5G:
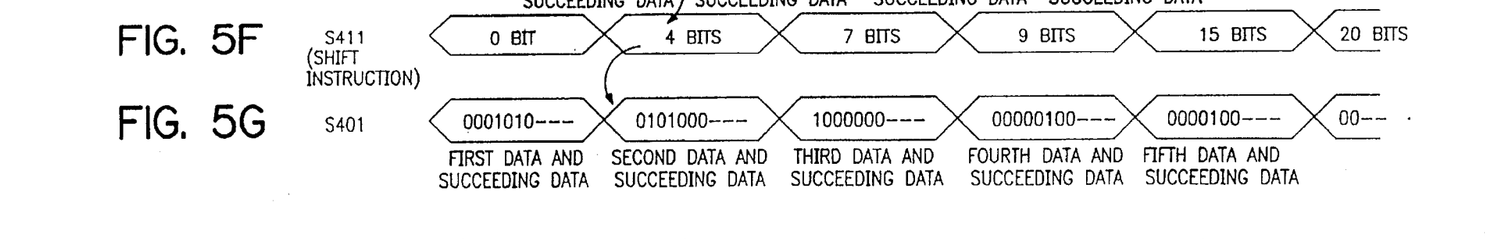

As is shown in FIG. 5C, the latch circuit 405 latches the data S403 in response to the rising of the clock signal and outputs this latched data S403 as the latch circuit data 405 (0001010 . . . ) to the variable-length code decoding part 413. The latch circuit 405 updates the data 405 in response to the rising of the clock signal. Accordingly, the data 405 does not vary during the cycle T1.

The variable-length code decoding part 413 performs the aforementioned collating operation upon reception of the data S405. (Matching and detecting time). The variable-length code decoding part 413 outputs the shift instruction S415 representing the code length of the variable-length code as a collating result at a time near the center of the cycle T1 (See FIG. 5O). During the cycle T1, the variable-length code decoding part 413 detected the variable-length code "0001" having a length code of "4 bits". The shift instruction S415 to shift the data by 4 bits is applied to an input terminal A of the adder 407 and the shift input terminal S of the second shifter 403. (Since the operation of the reset circuit 409 has been already cleared, the shift instruction S415 is applied to the shift input terminal S of the second shifter 403 by way of the reset circuit 409).

The second shifter 403 outputs the data 403 (010100 . . . ), which is produced by shifting the data (0001010 . . . ) output during the early stage of the cycle T1 by 4 bits (See FIG. 5E), to the latch circuit 405 in response to the shift instruction S415.

At the time near the center of the cycle T1, the shift instruction S407 which is output from the adder 407 is changed from the instruction to shift by 0 bits to an instruction to shift by 4 bits.

During the cycle T1, the output S401 of the first shifter 401 represents the variable-length code string (0001 . . . ) wherein the presently decoded variable-length code (first data) leads and the output S405 of the latch circuit 405 represents the variable-length code string (0001 . . . ) wherein the presently decoded variable-length code (first data) leads, and the output S411 of the latch circuit 411 represents a leading position of the presently decoded variable length code (0th bit counting from the initial state). In the latter stage of the cycle T1, the output S403 of the second shifter 403 represents the variable-length code string (01 . . . ) wherein the presently decoded variable-length code (second data) leads.

The operation of the variable-length code decoding system when a cycle T2 following the cycle T1 starts will now be described.

When the clock signal rises, the latch circuit 411 latches the shift instruction S407 (instruction to shift by 4 bits). The latch circuit 411 outputs the shift instruction S411 to shift by 4 bits to the first shifter 401.

The first shifter 401 shifts the variable-length code string by 4 bits in response to the shift instruction S411. Accordingly, the first shifter 401 outputs the shifted data S401 (010100 . . . ) to the second shifter 403.

When the clock signal rises, the latch circuit 405 latches the data S403 (010100 . . . ). The latch circuit 405 outputs this latched data (010100 . . . ) to the variable-length code decoding part 413 as the data S405.

The variable-length code decoding part 413 performs the collating operation upon reception of the data S405. (Matching and detecting time). The variable-length code decoding part 413 outputs the shift instruction S415 representing the code length of the variable-length code as a collating result at a time near the center of the cycle T2. During the cycle T2, the variable-length code decoding part 413 detected the variable-length code "010" having the code length of "3 bits". The shift instruction 415 to shift the data 3 bits is applied to the input terminal A of the adder 407 and the shift input terminal S of the second shifter 403.

The second shifter 403 outputs the data S403 (100000 . . . ), which is produced by shifting the data (010100 . . . ) output during the early stage of the cycle T2 by 3 bits, to the latch circuit 405 in response to the shift instruction S415.

At the time near the center of the cycle T2, the adder 407 adds an instruction to shift by 4 bits which is applied to an input terminal B and an instruction to shift by 3 bits which is applied to the input terminal A and it outputs the shift instruction 407 to shift by 7 bits to the latch circuit 411.

During the cycle T2, the output S401 of the first shifter 401 represents the variable-length code string (010 . . . ) wherein the presently decoded variable-length code (second data) leads and the output 405 of the latch circuit 405 represents the variable-length code string (010 . . . ) wherein the presently decoded variable-length code (second data) leads, and the output S411 of the latch circuit 411 represents a leading position of the presently decoded variable length code (4th bit counting from the initial state). In the latter stage of the cycle T2, the output 403 of the second shifter represents the variable-length code string (10 . . . ) wherein the presently decoded variable-length code (third data) to be decoded in the next cycle leads.

The operation of the variable-length code decoding system when a cycle T3 following the cycle T2 starts will now be described.

When the clock signal rises, the latch circuit 411 latches the shift instruction S407 (instruction to shift by 7 bits). The latch circuit 411 outputs the shift instruction S411 to shift by 7 bits to the first shifter 401.

The first shifter 401 shifts the variable-length code string by 7 bits alone in response to the shift instruction S411. Accordingly, the first shifter 401 outputs the shifted data S401 (100000 . . . ) to the second shifter 403.

When the clock signal rises, the latch circuit 405 latches the data S403 (100000 . . . ). The latch circuit 405 outputs this latched data (100000 . . . ) to the variable-length code decoding part 413 as the data S405.

The variable-length code decoding part 413 performs the collating operation upon reception of the data S405. (Matching and detecting time). The variable-length code decoding part 413 outputs the shift instruction S415 representing the code length of the variable-length code as a collating result at a time near the center of the cycle T3. During the cycle T3, the variable-length code decoding part 413 detected the variable-length code "10" having the length code of "2 bits". The shift instruction 415 to shift the data by 2 bits is applied to the input terminal A of the adder 407 and the shift input terminal S of the second shifter 403.

The second shifter 403 outputs the data S403 (000001 . . . ), which is produced by shifting the data (100000 . . . ) output during the early stage of the cycle T3 by 2 bits, to the latch circuit 405 in response to the shift instruction S415.

At the time near the center of the cycle T3, the adder 407 adds an instruction to shift by 7 bits which is applied to the input terminal B and an instruction to shift by 2 bits which is applied to the input terminal A and it outputs the shift instruction S407 to shift by 9 bits to the latch circuit 411.

During the cycle T3, the output S401 of the first shifter 401 represents the variable-length code string (10 . . . ) wherein the presently decoded variable-length code (third data) leads and the output 405 of the latch circuit 405 represents the variable-length code string (10 . . . ) wherein the presently decoded variable-length code (third data) leads, and the output S411 of the latch circuit 411 represents a leading position of the presently decoded variable length code (7th bit counting from the initial state). In the latter stage of the cycle T3, the output S403 of the second shifter 403 represents the variable-length code string (000001 . . . ) wherein the presently decoded variable-length code (fourth data) leads.

According to the variable-length code decoding system, the input variable-length code string is decoded by repeating the aforementioned operations.

As mentioned above, according to the variable-length code decoding system, the variable-length code can be decoded always during one cycle since the variable-length code string is shifted so that the variable-length code to be decoded in the next cycle leads before the appearance of the next cycle. Accordingly, it is possible to satisfy the image display rate on the display of the TV set or the monitor which displays the image when restoring the image. That is, it is possible to display the correct image on the display. As a result, the image processing can be performed at higher speed.

Industrial Utilization

According to the variable-length code decoding circuit, the content of the data to be input and the length of the data can be detected at higher speed.

According to the variable-length code decoding circuit, the content of the data to be input and the length of the data can be detected at higher speed even in the case where the sequence of the data to be input and the length of the data are undefined.

According to the variable-length code decoding system, it is possible to decode the data which is always input during one cycle. Accordingly, the image processing can be performed at higher speed.

What is claimed is:

1. A variable-length code decoding circuit for decoding input data, comprising:

a plurality of first data lines to which variable-length code data are applied;

a plurality of second data lines to which data that represent the length of the variable-length code data are applied;

a plurality of first storage circuits for storing the variable-length code data, said first storage circuits being arranged in a line;

a plurality of second storage circuits for storing the data which represent the length of the variable-length code data, said second storage circuits being arranged in said line;

a plurality of first switching circuits, each first switching circuit being coupled between a respective fist storage circuit and a respective first data line, for selectively connecting said respective first storage circuit to said respective first data line in response to a potential applied to a word line;

a plurality of second switching circuits, each second switching circuit being coupled between a respective second storage circuit and a respective second data line, for selectively connecting said respective second storage circuit to said respective second data line in response to said potential applied to the word line;

said word line being commonly coupled to said first and second switching circuits;

a plurality of data collating circuits, each data collating circuit being coupled to a respective first storage circuit and first data line, for collating input data applied to the first data line with the data stored in said respective first storage circuit and for outputting a collating result signal;

a collating result output line; and a plurality of gates, each gate being coupled between a respective collating circuit and said collating result output lines, for selectively inhibiting said collating result signal from being output to said collating result output line in response to the data stored in said second storage circuits.

2. A variable-length code decoding circuit according to claim 1, wherein said first and second storing circuits are arranged side by side in pairs along said line.

3. A variable-length code decoding circuit according to claim 1, wherein said first and second storing circuits are arranged alternately along said line.

4. A variable-length code decoding circuit according to claim 1, wherein each collating circuit comprises first and second transistors which are coupled between said first data line and the respective gate in series.

5. A variable-length code decoding circuit according to claim 4, wherein said first transistor is controlled by the data stored in said first storage circuit and said second transistor is controlled by a potential applied to a match enable line.

6. A variable-length code decoding circuit for decoding input data, comprising:

a plurality of first data line pairs to which variable-length code data are applied;

a plurality of second data line pairs to which data that represent the length of the variable-length code data are applied;

a plurality of first storage circuits for storing the variable-length code data, said first storage circuits being arranged in a line;

a plurality of second storage circuits for storing the data which represent length of the variable-length code data, said second storage circuits being arranged in said line;

a plurality of first switching circuits, each first switching circuit being coupled between a respective first storage circuit and a respective first data line pair, for selectively connecting said respective first storage circuit to said respective first data line pair in response to a potential applied to a word line;

a plurality of second switching circuits, each second switching circuit being coupled between a respective second storage circuit and a respective second data line pair, for selectively connecting said respective second storage circuit to said respective second data line pair in response to said potential applied to the word line;

said word line being commonly coupled to said first and second switching circuits;

a plurality of data collating circuits, each data collating circuit being coupled to a respective first storage circuit and first data line pair, for collating input data applied to the first data line pair with the data stored in said respective first storage circuit and for outputting a collating result signal;

a collating result output line; and a plurality of gates, each gate being coupled between a respective collating circuit and said collating result output line, for selectively inhibiting said collating result signal from being output to said collating result output line in response to the data stored in said second storage circuits.

7. A variable-length code decoding circuit according to claim 6, wherein said first and second storing circuits are arranged side by side in pairs along said line.

8. A variable-length code decoding circuit according to claim 6, wherein said first and second storing circuits are arranged alternately along said line.

9. A variable-length code decoding circuit according to claim 6, wherein each collating circuit comprises first and second transistors which are coupled between one data line of a respective first data line pair and the respective gate in series, and third and fourth transistors which are coupled between the other data line of the respective first data line pair and the respective gate in series.

10. A variable-length code decoding circuit according to claim 9, wherein said first and second transistors are controlled by the data stored in said first storage circuit and said third and fourth transistors are controlled by a potential applied to a match enable line.

11. A variable-length code decoding circuit for decoding input data, comprising:

a plurality of memory units disposed in an array having rows and columns, the memory units of each row storing a respective variable-length code word and comparing the respective variable-length code word to the input data;

a plurality of bit line pairs connected to the array;

a plurality of match enable lines connected to the array;

a plurality of match lines; and a plurality of switches to selectively connect the match lines to the array, wherein each memory unit comprises a RAM cell having a memory circuit which stores a mask bit and a CAM cell having a memory circuit which stores a variable-length code bit, the memory circuit of the CAM cell having first and second memory circuit codes, the CAM cell additionally including first, second, third, and fourth transistors connected in series between one of the bit lines of a respective one of the bit line pairs and the other bit line of the respective bit line pair, the first and fourth transistors having gates that are connected to a respective one of the match enable lines, the second transistor having a gate which is connected to the first memory circuit node, the third transistor having a gate which is connected to the second memory circuit node, the second and third transistors being connected to each other at a collating result output node, the collating result output node being connected to a respective one of the switches, the respective switch having a control electrode which is responsive to the mask bit stored in the RAM cell.

12. A variable-length code decoding circuit according to claim 11, further comprising a plurality of additional bit line pairs connected to the array, and wherein the RAM cell further includes a fifth transistor connected between one of the bit lines of a respective one of the additional bit line pairs and the memory circuit of the RAM cell, and a sixth transistor connected between the other of the bit lines of the respective additional bit line pair and the memory circuit of the RAM cell.

13. A variable-length code decoding circuit according to claim 12, wherein the CAM cell further includes another transistor connected between the first memory cell node and said one of the bit lines of the respective bit line pair, and an additional transistor connected between the second memory cell node and said other bit line of the respective bit line pair.

14. A variable-length code decoding circuit according to claim 11, wherein the CAM cell further includes another transistor connected between the first memory cell node and said one of the bit lines of the respective bit line pair, and an additional transistor connected between the second memory cell node and said other bit line of the respective bit line pair.

15. A variable-length code decoding circuit according to claim 11, further comprising match line output circuits connected to the match lines, and a memory connected to the match line output circuits.

16. A variable-length code decoding circuit according to claim 15, further comprising a memory connected to the match line output circuits.

17. A variable-length code decoding circuit according to claim 16, further comprising an adder connected to the memory, a first shifter connected to the adder, the first shifter receiving the input data, and a second shifter connected to the first shifter.

* * * * *